(12) United States Patent
Mashio et al.

(10) Patent No.: US 6,599,771 B2
(45) Date of Patent: Jul. 29, 2003

(54) THERMAL INFRARED SENSOR AND A METHOD OF MANUFACTURING THE SAME

(75) Inventors: Naoya Mashio, Yokohama (JP); Yoshinori Iida, Tokyo-To (JP); Keitaro Shigenaka, Hachioji (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/819,898

(22) Filed: Mar. 29, 2001

(65) Prior Publication Data
US 2001/0025926 A1 Oct. 4, 2001

(30) Foreign Application Priority Data
Mar. 30, 2000  (JP) ........................................ 2000-095812

(51) Int. Cl.$^7$ ............................................. H01L 21/00
(52) U.S. Cl. ..................... 438/57; 438/482; 438/619; 438/760
(58) Field of Search .................. 438/57, 760, 619, 438/482

(56) References Cited

U.S. PATENT DOCUMENTS

| | | | | |
|---|---|---|---|---|
| 5,365,054 A | * | 11/1994 | Fathauer et al. | 250/214.1 |
| 5,403,752 A | * | 4/1995 | Bruchhaus et al. | 205/656 |
| 5,523,564 A | * | 6/1996 | Yamada et al. | 250/332 |
| 5,798,684 A | * | 8/1998 | Endo et al. | 29/612 |
| 5,930,595 A | * | 7/1999 | Sridhar et al. | 257/414 |
| 6,093,330 A | * | 7/2000 | Chong et al. | 216/11 |
| 6,163,061 A | | 12/2000 | Iida | |
| 6,204,083 B1 | * | 3/2001 | Kodato et al. | 438/43 |

FOREIGN PATENT DOCUMENTS

| | | |
|---|---|---|
| JP | 11-74483 | 3/1999 |
| JP | 2000-12858 | 1/2000 |

OTHER PUBLICATIONS

"Low–cost 320×240 uncooled IRFPA using conventional silicon IC process," by Tomohiro Ishikawa et al., Part of the SPIE Conference on Infrared Technology and Applications XXV, Orlando, Florida, Apr. 1999, SPIE vol. 3698, pp. 556–564.

U.S. patent application Ser. No. 10/244,403, filed Sep. 17, 2002, pending.

T. Sato, et al., Symposium on VLSI Technology Digest of Technical Papers, pp. 206–207, "Trench Transformation Technology Using Hydrogen Annealing for Realizing Highly Reliable Device Structure With Thin Dielectric Films", 1998.

S. Matsuda, et al., IEEE, IDEM, pp. 137–140, "Novel Corner Rounding Process for Shallow Trench Isolation Utilizing MSTS (Micro–Structure Transformation of Silicon)", 1998.

T. Sato, et al., IEEE, IEDM, pp. 517–520, "A New Substrate Engineering for the Formation of Empty Space in Silicon (ESS) Induced by Silicon Surface Migration", 1999.

U.S. patent application Ser. No. 10/108,391, filed Mar. 29, 2002, pending.

(List continued on next page.)

Primary Examiner—Richard Elms
Assistant Examiner—Michael K. Luhrs
(74) Attorney, Agent, or Firm—Oblon, Spivak, McClelland, Maier & Neustadt, P.C.

(57) ABSTRACT

A thermal type infrared sensor and a method of manufacturing the same that have a high degree of freedom of structure and a low cost. An infrared ray detecting portion and a support leg are formed above flat plate-shape void formed inside of a semiconductor substrate, and a processing circuit section of a signal from a detecting portion is fabricated on the semiconductor substrate. Because the structure of the processing circuit section is not influenced by a substrate structure, characteristics are improved. Furthermore, the structure is simplified, and it is possible to reduce a manufacturing cost.

11 Claims, 8 Drawing Sheets

OTHER PUBLICATIONS

U.S. patent application Ser. No. 10/106,787, filed Mar. 27, 2002, pending.
U.S. patent application Ser. No. 09/624,996, filed Jul. 25, 2000, pending.
U.S. patent application Ser. No. 09/819,596, filed Mar. 29, 2001, pending.
U.S. patent application Ser. No. 09/964,696, filed Sep. 28, 2001, pending.

* cited by examiner

THERMAL INFRARED SENSOR AND A METHOD OF MANUFACTURING THE SAME

CROSS REFERENCE TO RELATED APPLICATIONS

The subject application is related to subject matter disclosed in Japanese Patent Application No. H12-95812 filed on Mar. 30, 2000 in Japan to which the subject application claims priority under Paris Convention and which is incorporated herein by reference.

BACKGROUND OF THE INVENTION

1. Field of the Invention

The present invention relates to a thermal type infrared sensor and a method of manufacturing the same. More specially, the present invention relates to a thermal type infrared sensor to detect an infrared signal incident from outside, and a thermal type infrared sensor and method of manufacturing the same which manufacturing is easy, accuracy is high and a SOI substrate is unnecessary.

2. Related Background Art

An infrared sensor can detect objects regardless of day and night, and has a feature in which permeability of an infrared ray for smoke and fog is higher than that of a visible light. Furthermore, because it is possible to obtain temperature information of objects, the infrared sensor is widely used as a surveillance camera and a fire-detecting camera.

As an example of thermal infrared sensor to detect the incident infrared ray, a thermal infrared sensor structure having a pn junction to a detecting portion will be described hereinafter.

The pn junction type of the infrared sensor uses a principle that temperature of the pn junction changes by absorption of the infrared ray, and height of diffusion potential barrier and the number of carriers of the pn junction change by the temperature change.

More specifically, surface of the sensor is provided with an infrared absorber of which temperature changes by irradiation of the infrared ray. The temperature change is, for example, transmitted to a transistor circuit including the pn junction in order to allow a band structure of the pn junction to change. The change of the band structure is read out by voltage change in low current operation. By such a method, the irradiated infrared ray is monitored, and shape of a measuring object and its surface temperature can be detected.

Next, an example of a conventional pn junction type of the infrared sensor will be described by using drawings.

FIG. 1 and FIG. 2 are drawings showing schematic configuration showing an example of a conventional pn junction type of the infrared sensor. FIG. 1 is a plane view, and FIG. 2 is a cross sectional view of an A–A' line.

In these drawings, numeral 1 denotes a substrate, numeral 2 denotes a detecting portion, numeral 4 denotes a support leg, and numeral 7 denotes a processing circuit section. The substrate under the detecting portion 2 and the support leg 4 is removed by a micro machining and an etching technology in order to form a void. The detecting portion 2 is supported at midair by the support leg 4 extending from the substrate 1.

The detecting portion 2 is formed so that an insulating substrate 12 and insulating films 23 and 32 overlap a detecting layer 21, and an infrared absorption layer 22 is provided on top of the insulated film 32. The infrared ray irradiated to the detecting portion 2 is absorbed by the infrared absorption layer 22. As a result, temperature of the detecting portion 2 goes up. The temperature change is converted into an electric signal by the detecting layer 21, in order to detect the infrared ray. The electric signal converted by the detecting portion 2 is led to the processing circuit section 7. The processing circuit section 7 carries out signal processing in order to perform conversion to an output signal.

In such a conventional structure, in order to improve detecting sensitivity, adiathermancy between the detecting portion 2 and the substrate 1 is important. That is, it is necessary to minimize heat slipping from the detecting portion 2 to the substrate 1. Because of this, the detecting portion 2 is separated from the substrate 1 by the void 6, and a contact point for the substrate 1 is only the support leg 4. The support leg 4 is formed by a material that thermal conductance is low, and it is necessary to restrict the thermal conductance to the substrate by fabricating the support leg 4 thinly and longly by using a micro machining technology, in order to reduce the thermal conductance to the substrate 1.

As a method of forming the void 6 necessary to thermally separate the detecting portion 2 from the substrate 1, an anisotropic etching is used. As an example of etching solutions, there are a potassium hydroxide (KOH) solution and a tetramethylammonium hydroxide (TMAH). The void 6 is fabricated by infusing an etching hole made by the micro machining technology with the above-mentioned etching solution. When fabricating the void 6, it is necessary that the detecting layer 21 be wholly overlapped by the insulating substrate 12 and the insulating films 23 and 32. If the detecting layer 21 contacts the etching hole 51 and the silicon substrate 11, not only the silicon substrate 11 but also the detecting layer 21 are etched when carrying out the anisotropic etching.

In order to easily realize the structure to wholly overlap the above-mentioned detecting portion 2 by the insulating film, there is a method of using a SOI (Silicon-On-Insulator) substrate that the insulating film and a single crystal silicon film are formed on the substrate in order. In the above-mentioned structure, the insulating film plays a role of the insulating substrate 12, and the detecting layer 21 is formed in the SOI portion. After forming the detecting layer 21, the insulating films 23 and 32 are formed on side and top of the detecting portion.

However, in case of using the SOI substrate, thickness of the single crystal silicon substrate and the insulating film has to be determine to take sensitivity of the infrared ray, the anisotropic etching step and so on into account. For example, the structure of a proposed example, i.e. Part of SPIE Conference on Infrared Technology and Applications XXV, vol3698, pp556–564, 1999, uses the pn junction formed to transverse direction. In this example, the single crystal silicon layer has to be thickened in order to enlarge junction area. When the film thickness of the insulating film becomes thick, thermal capacity of the detecting portion increases and high-speed performance of the detecting portion is damaged. On the other hand, when the film thickness of the insulating film becomes thin, the insulating film does not function as an etching block for the detecting layer when carrying out the anisotropic etching.

However, in order to form the detecting portion and the processing circuit on the same SOI substrate, the thicknesses of the single crystal silicon and the insulating layer has to be the same as that of the detecting portion. Therefore, the structure of the semiconductor elements included in the processing circuit section is restricted. For example, in case of using a MOSFET in the processing circuit section, it becomes difficult to avoid influence such as a substrate floating effect or a short channel effect.

Furthermore, because the SOI substrate is more expensive than the silicon substrate, the SOI substrate is also a drawback even in a total cost.

SUMMARY OF THE INVENTION

An object of the present invention is to provide a thermal type infrared sensor and a method of manufacturing the same which form a structure that a detecting portion is thermally separated from a substrate without using an expensive substrate such as a SOI substrate and without an etching step, and have a structure capable of arbitrarily designing thicknesses of a single crystal silicon and an insulating film of the detecting portion and the processing circuit section without being restricted to the structure of the substrate. Therefore, it is possible to reduce cost for manufacturing a thermal infrared sensor of pn junction type, thereby improving characteristics of the detecting portion and the processing circuit section.

In order to achieve the foregoing object, a thermal infrared sensor, comprising:

a detecting portion including an absorbing section configured to absorb an incident infrared ray and convert the infrared ray into heat, and a thermoelectric converting section configured to convert temperature change by heat occurred in said absorbing section into an electric signal; and a processing circuit section including semiconductor elements to process said electric signal obtained by said detecting portion, wherein said detecting portion is supported in the state of being separated from a semiconductor substrate by at least one of support legs extending to a side face of said detecting portion;

wherein a flat plate-shape void is formed between said detecting portion and said semiconductor substrate; and wherein said processing circuit section is formed directly on said semiconductor substrate without sandwiching an insulating film.

According to the present invention, because a processing circuit section formed on a semiconductor substrate in order to process a signal detected by a detecting portion is formed so as to contact the semiconductor substrate, it is possible to constitute the processing circuit section without coming under the influence of a substrate structure which occurs in case of using a SOI substrate. Therefore, it is possible to improve characteristics of the processing circuit.

Furthermore, according to the present invention, it is possible to reduce an element capacitance by forming a partial void to the semiconductor element of the processing circuit section, and a substrate floating effect and a short channel effect can be reduced because the element contacts the substrate.

Furthermore, according to the present invention, it is possible to increase the number of the elements by separating the semiconductor elements of the detecting portion by the insulating film, thereby improving detecting sensitivity.

Furthermore, according to the present invention, because an oxide film is formed on internal face of a flat plate-shape void, the oxide film functions as an etching stop layer when fabricating a separated groove for the element separation. Accordingly, it is possible to stably form the element-separated structure, even if the detecting layer is a very thin structure. Furthermore, the oxide film functions as a film for protecting the detecting layer.

Furthermore, according to the present invention, because an optical distance of a depth of the flat plate-shape void is set to substantially ¼ of the incident infrared ray wavelength, intensity of the infrared ray reflected by a bottom face of the void becomes highest at a location of the detecting portion, thereby improving the detecting sensitivity.

Furthermore, according to the present invention, a flat plate-shape void is fabricated in the substrate by an ESS method, the detecting portion is fabricated in the single crystal silicon layer above the void, the processing circuit section is fabricated on the substrate, and a groove is formed to form the support leg. In this step, it is possible to thermally separate the detecting portion from the substrate without providing the etching step. Furthermore, it is unnecessary to use an expensive substrate such as the SOI substrate, and it is possible to simplify manufacturing steps and to reduce cost.

Thus, according to the present invention, it is possible to provide a thermal type infrared sensor with high efficiency at low cost. Accordingly, industrial advantage of the present invention is very large.

Furthermore, a method of manufacturing a thermal type infrared sensor including a detecting portion configured to absorb an infrared ray and perform thermoelectric conversion, and a processing circuit section including semiconductor elements to process an electric signal obtained by said detecting portion, said detecting portion being supported in the state of being separated from a semiconductor substrate by at least one or more of a support leg extending to a side face of said detecting portion, composing the steps of:

forming a plurality of trenches on the semiconductor substrate;

closing up opening of each of said plurality of trenches in order to change said trenches into a flat plate-shape void, by performing a heat treatment to the semiconductor substrate;

forming said detecting layer in a single crystal silicon layer above said flat plate-shape void;

forming said processing circuit section on said semiconductor substrate; and forming said support leg by forming a support leg-forming groove of penetrating to said flat plate-shape void.

Here, as a method of forming the flat plate-shape void, there is a method described to a specification applied to Japanese Patent Office, i.e. application number 246582/1999 (H11-246582). This method relates to the ESS (formation of empty space in silicon) method. This method fabricates two-dimensional grooves (trenches) with the same depth at a constant interval. Only upper portions of the grooves are closed up by performing high temperature anneal in hydrogen air, and the lower portions of the grooves are combined with near grooves. As a result, the flat plate-shape void is formed in the silicon substrate, and the flat plate shape of the single crystal silicon is formed on the upper portion of the void.

Figure 8A:
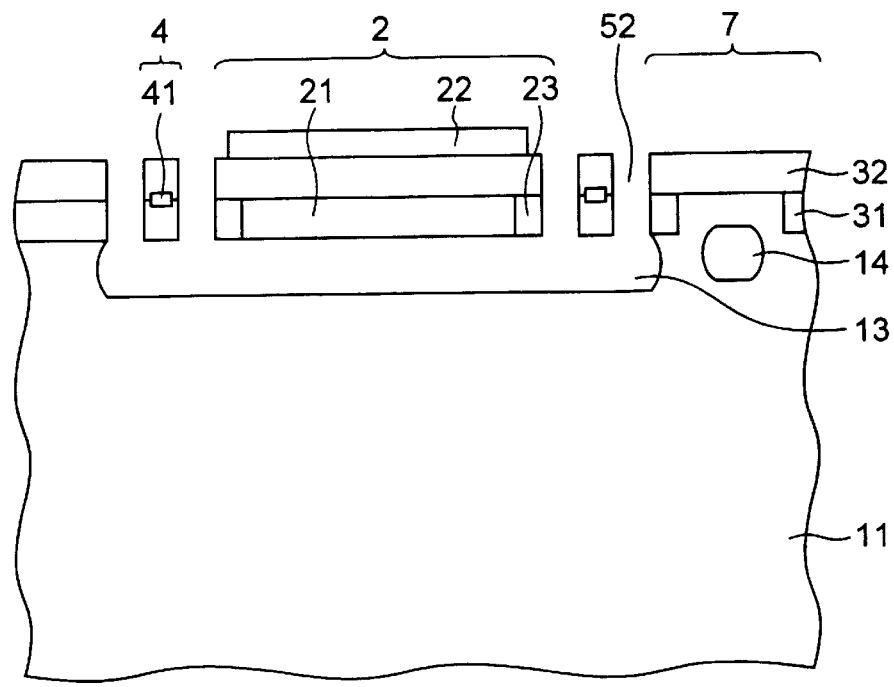
Figure 8B:
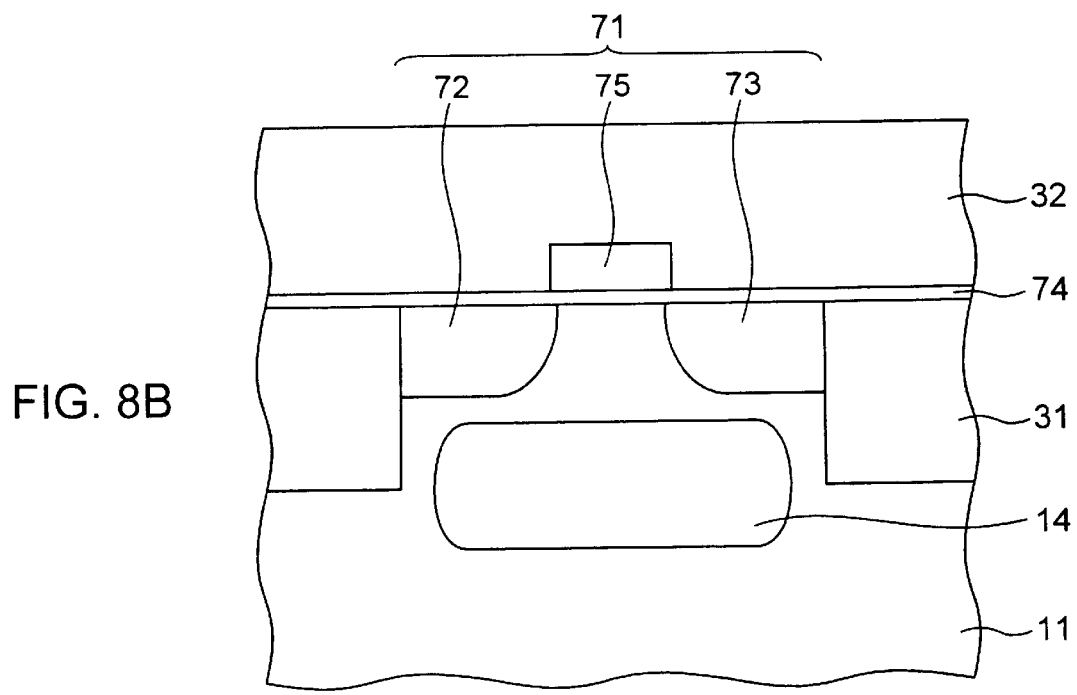
Figure 9:
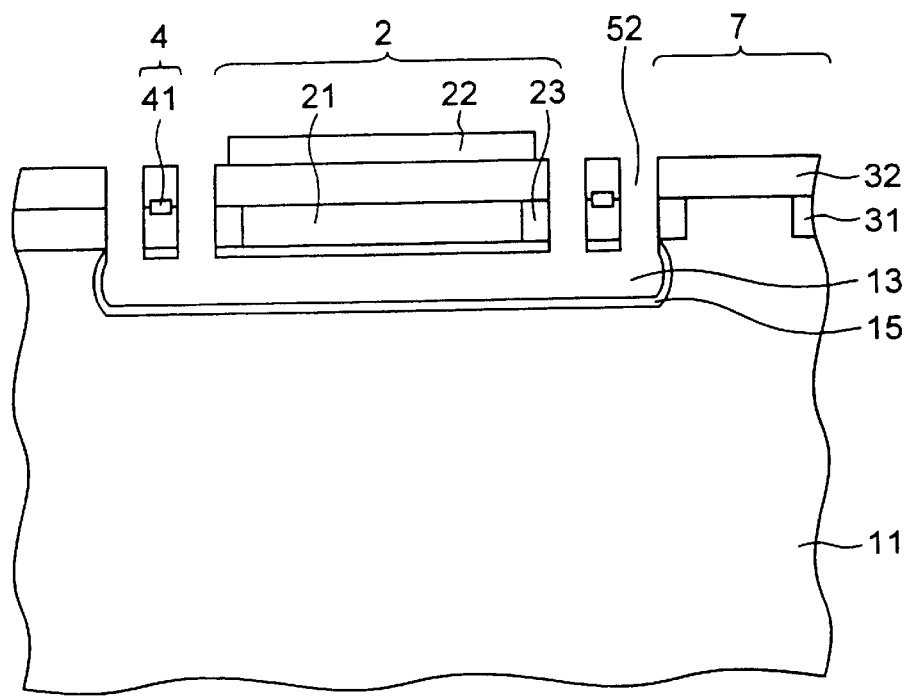
Figure 10:
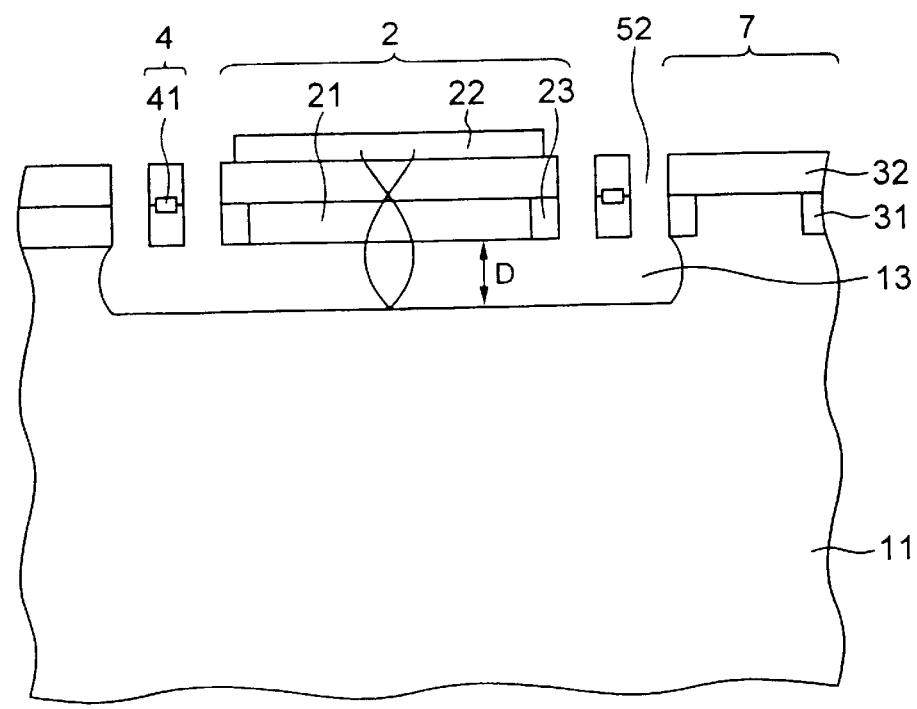

a FIGS. 8A–8B is a sectional drawing and an enlarged sectional drawing showing a structure of a thermal type infrared sensor according to a second embodiment of the present invention;

FIG. 9 is a sectional drawing showing a structure of a thermal type infrared sensor according to a third embodiment of the present invention; and FIG. 10 is a sectional drawing showing a structure of a thermal type infrared sensor according to a fourth embodiment of the present invention.

DESCRIPTION OF THE PREFERRED EMBODIMENTS

Hereinafter, embodiments according to the present invention will be described in detail with reference to drawings.

First Embodiment

Figure 3:
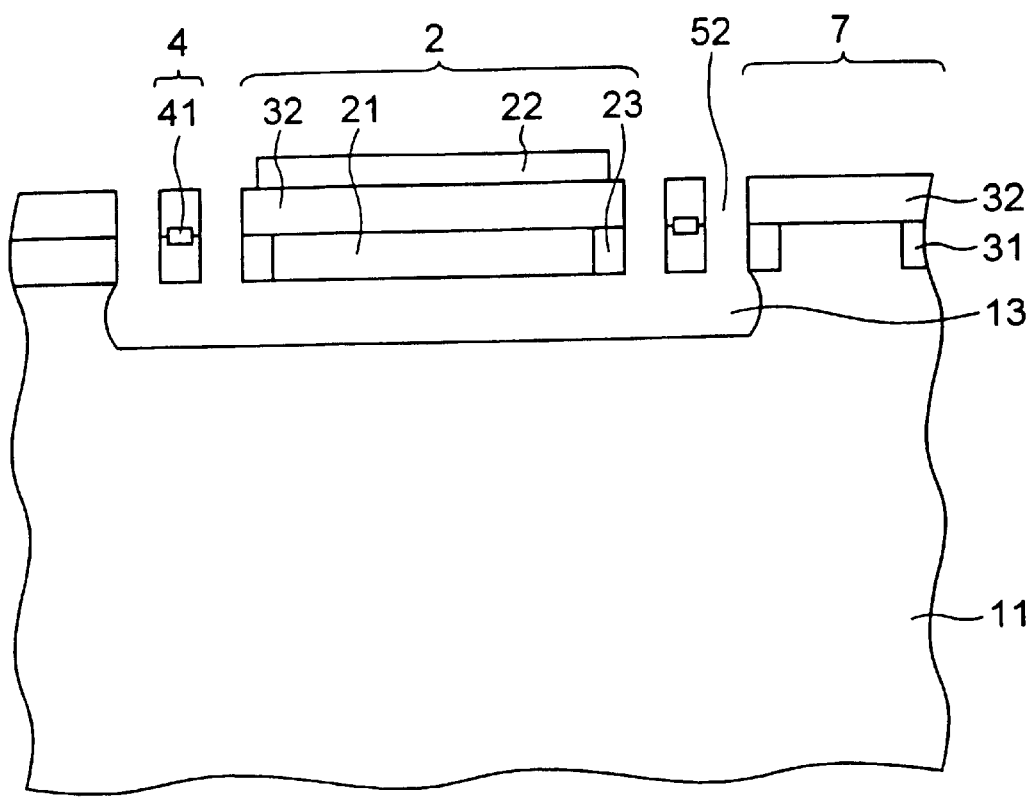
FIG. 3 is a sectional drawing of a thermal type infrared sensor according to a first embodiment of the present invention.

FIG. 3 is a conceptual drawing showing sectional structure of a thermal type infrared sensor according to a first embodiment according to the present invention. That is, the infrared sensor of FIG. 3 includes a semiconductor element which concretely has a pn junction. Numeral 11 denotes a silicon substrate, numeral 13 denotes a flat plate void, numeral 2 denotes a detecting portion, numeral 4 denotes a support leg, and numeral 7 denotes a processing circuit section.

The detecting portion 2 is supported by the support leg 4, and the support leg 4 is connected to the silicon substrate 11. That is, the detecting portion 2 is provided to a midair portion formed in the silicon substrate 11, and the detecting portion 2 is supported in the state of being separated from the silicon substrate 11 by the support leg 4 extending from a sidewall of the midair portion to a side face of the detecting portion 2.

The detecting portion 2 includes a detecting layer 21 composed of transistors including the pn junction, an insulating layer 32 on the detecting layer, an insulating layer 23 used for element separation of the transistor including the pn junction in the detecting layer, an insulating layer on the detecting layer, and an infrared absorption layer 22.

Figure 4A:
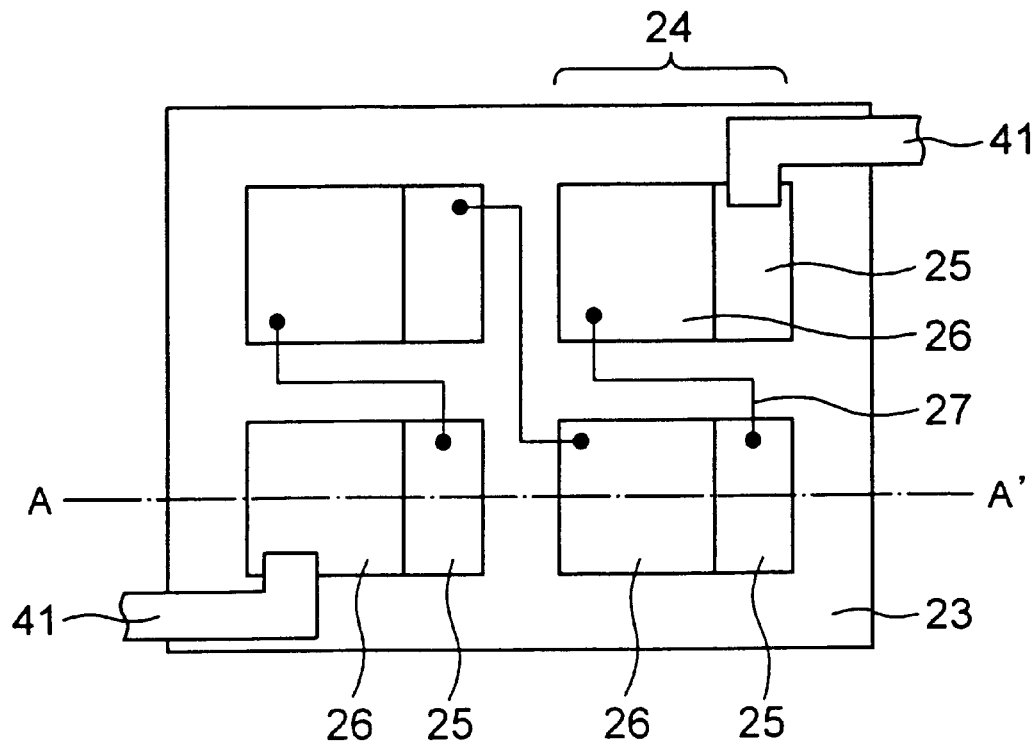
FIG. 4A is a conceptual drawing showing another example of plane structure of the detecting layer.
Figure 4B:
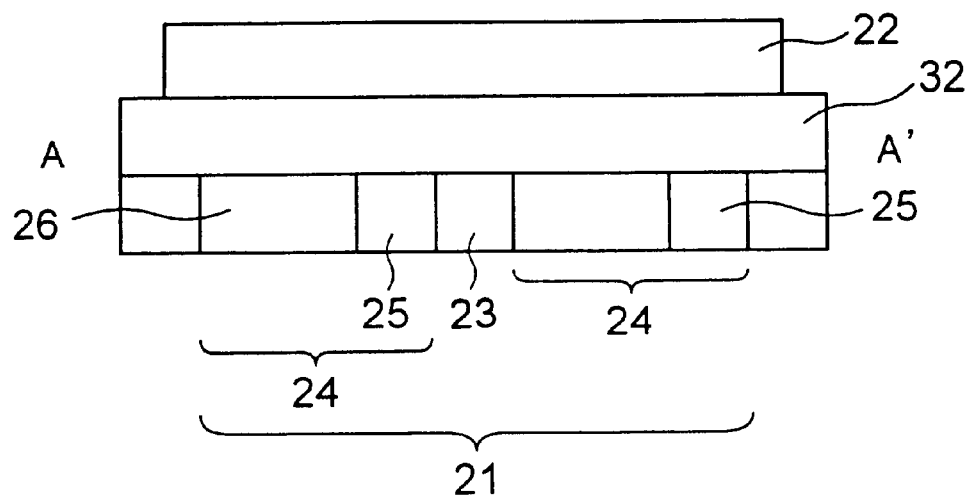
FIG. 4B is a diagram of an A–A' line of FIG. 4A.

FIG. 4A is a conceptual drawing showing an example of plain configuration of the detecting layer 21. FIG. 4B is sectional drawing of an A–A' line in FIG. 4A. These drawings show an example of forming four pn junction elements of transverse type which are separated by the insulating film 23. The insulating film 23 for the element separation can be formed, for example, by the al oxide of the silicon. These pn junction elements are connected by an internal inter connection 27 in series. Thus, by connecting a plurality of the pn junction elements in series, it is possible to improve sensitivity for temperature change by incident infrared ray.

Figure 5A:
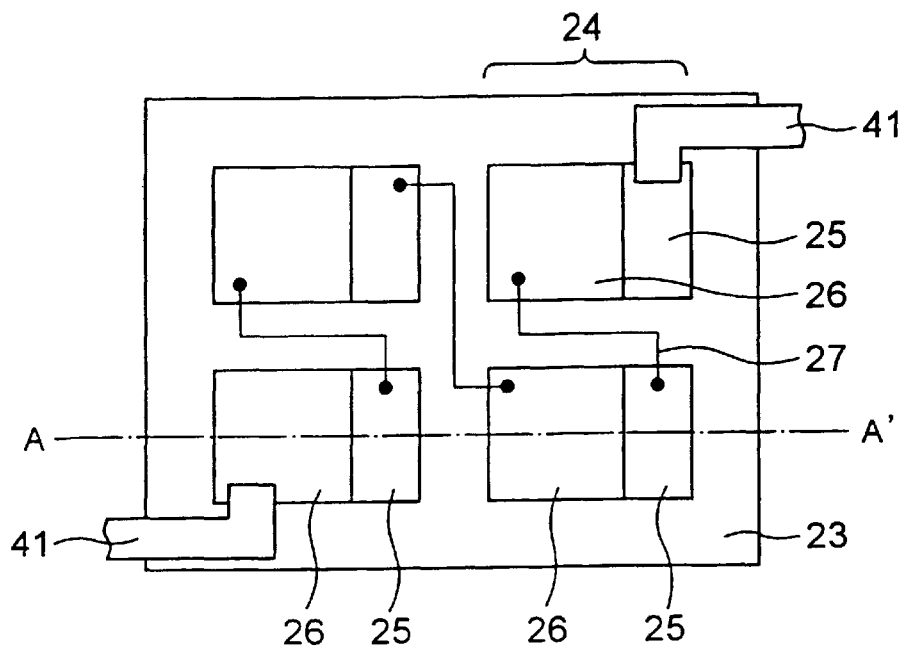
FIG. 5A is a conceptual drawing showing an example of plane structure of the detecting layer.
Figure 5B:
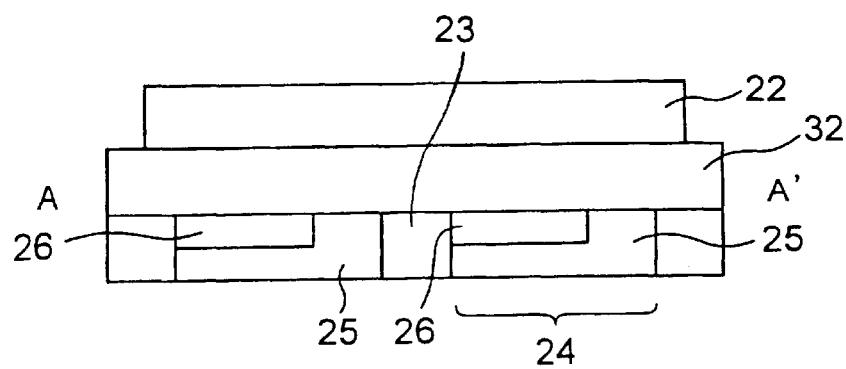
FIG. 5B is a sectional drawing of an A–A' line.

FIG. 5A is a conceptual drawing showing an other example of flat configuration of the detecting layer 21, and FIG. 5B is a sectional drawing of an A–A' line in FIG. 5A. The example of FIG. 5A and FIG. 5B has four pn junction elements which are vertical type elements composed of a first conduction type semiconductor 25 and a second conduction type semiconductor 26. These pn junction elements are separated by the insulating film 23. Even in case of this example, because a plurality of pn junction elements are connected in series, it is possible to improve the sensitivity for the temperature change. In this example, if the pn junction element of vertical type is formed, it is possible to enlarge a pn junction area more than that of the pn junction of transverse type, thereby improving detecting sensitivity for temperature change.

Figure 5C:
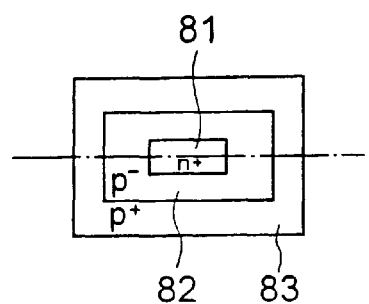
FIG. 5C is a plan view showing a structure of a pn junction element.
Figure 5D:
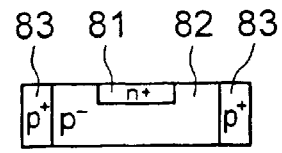
FIG. 5D is a sectional drawing of an A–A' line of FIG. 5C.

Furthermore, when forming the pn junction element, a $p^+p^-n^+$ structure is desirable. FIG. 5C is a plan view of the pn junction element of the $p^+p^-n^+$ structure, FIG. 5D is a sectional view of an A–A' line of FIG. 5C. Periphery of an $n^+$ region 81 is provided with a $p^-$ region 82, and periphery of a $p^-$ region 82 is provided with a $p^+$ region 83. Because a schottky resistance of the $p^-$ region 82 is high, it is possible to lower the schottky resistance by providing the $p^+$ region 83 in periphery of the $p^-$ region 82, thereby obtaining the pn junction element of which the detecting sensitivity is high.

In the infrared sensor showing in FIG. 3, the infrared ray irradiated to the detecting portion 2 is absorbed by the infrared absorption layer 22, thereby raising temperature of the detecting portion 2. The temperature change is converted into an electric signal by the detecting layer 21 in order to detect the infrared ray. The electric signal converted by the detecting portion 2 is transmitted to transistors including the pn junction of the processing circuit section 7 via interconnection 41 in the support leg 4, and converted into an output signal after carrying out signal processing.

After the absorbed infrared ray is converted into heat, in order to be efficiently converted into the electric signal by the transistor including the pn junction in the detection layer 21, it is important that the detecting portion 2 is thermally separated from its periphery. Because of this, it is possible to realize a high thermal separation by providing a flat plate-shape void 13 between the detecting portion 2 and the silicon substrate 11, and connecting the detection portion 2 to the silicon substrate 11 by using the support leg 4 that thermal conduction performance is low.

Figure 1:
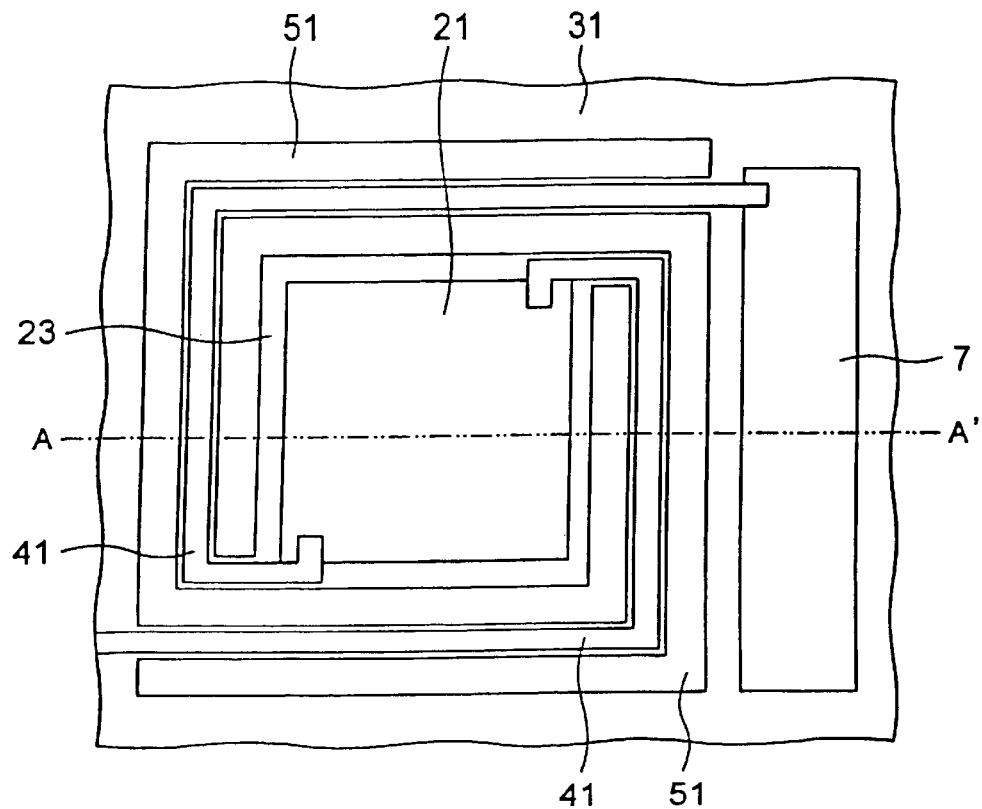
FIG. 1 is a top face view showing a structure of a conventional thermal type infrared sensor.
Figure 2:
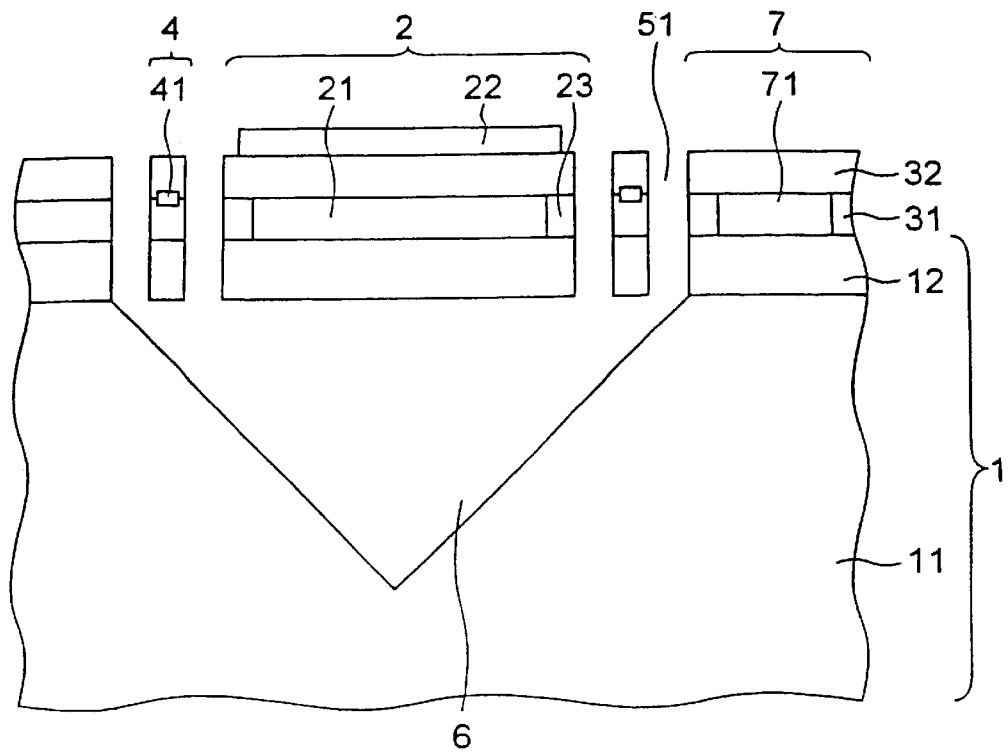
FIG. 2 is a sectional drawing a structure of a conventional thermal type infrared sensor.

As compared the infrared sensor of the present invention with a conventional infrared sensor showing in FIG. 1 and FIG. 2, the shape of the void under the detecting portion 2 is different from each other.

That is, in case of a conventional sensor showing in FIG. 1 and FIG. 2, anisotropic etching is performed by infusing an etching solution such as a potassium hydroxide (KOH) solution or a tetramethylammonium (TMA) solution. As a result, the void 6 under the detecting portion 2 is formed in a space of inverted pyramid shape in which a plane direction of the silicon substrate emerges.

On the other hand, in case of the infrared sensor of the present invention, the void 13 under the detecting portion 2 is a flat plate type, and the plane direction of the silicon does not outstandingly emerge. Accordingly, as described in detail in after-mentioned fourth embodiment, the infrared ray is efficiently reflected on bottom face of the flat plate-shape void 13, thereby further improving sensitivity.

Furthermore, the infrared sensor of the present invention is different from the conventional one even in the periphery circuit section. That is, as shown in FIG. 2, because the conventional sensor is formed on the SOI substrate, an embedded oxide film 12 is provided even under the periphery circuit section 7. On the other hand, the infrared sensor of the present invention does not exist under the periphery circuit section 7. As a result, it is unlikely that operation becomes unsteadily due to a substrate floating effect, as described after.

Figure 6A:
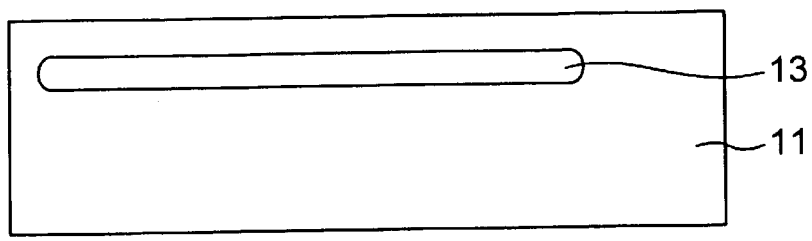
FIGS. 6A–6D is a sectional drawing of manufacturing steps showing a method of manufacturing a thermal type infrared sensor according to a first embodiment of the present invention.

Next, a method of manufacturing an infrared sensor according to the present embodiment will be explained. FIG. 6 is a sectional drawing showing main part of manufacturing steps of the infrared sensor according to the present invention. First of all, as shown in FIG. 6A, the flat plate-shape void 13 is formed in the silicon substrate 11. At this time, the present invention forms the flat plate-shape void 13 under the single crystal silicon layer without the anisotropic etching steps. This forming method, which is hereinafter referred to as an ESS (formation of Empty Space in Silicon) method, will be explained 174, with reference to FIG. 7.

FIG. 7 is a sectional drawing showing a method of forming the flat plate-shape void 13. First of all, as shown in FIG. 7A, a mask material M is formed on the silicon substrate 11, and then a photo resist pattern R is formed on the substrate 11. The mask material M will be described in detail later.

Figure 7A:
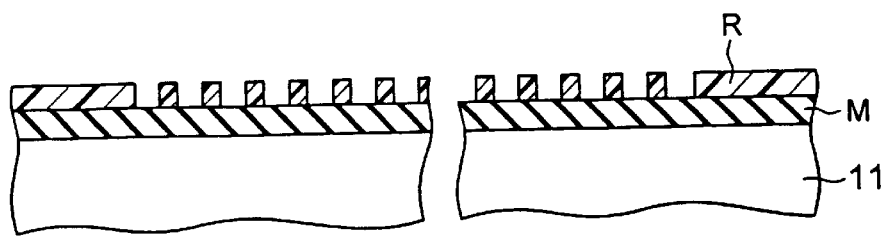
FIGS. 7A–7E is a sectional drawing of manufacturing steps showing a method of forming a flat plate-shape void according to the ESS method.
Figure 7B:
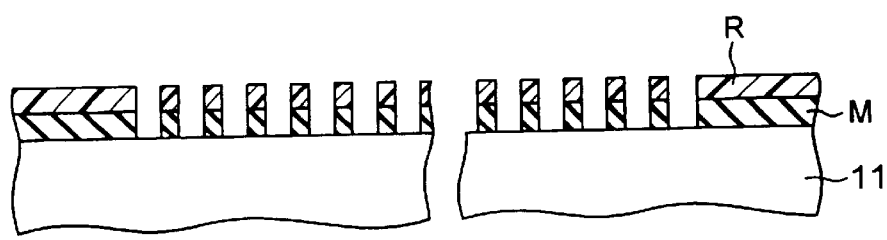

Next, as shown in FIG. 7B, by using the photo resist pattern R as a mask, the mask material M is patterned by the anisotropic etching, for example, a RIE (Reactive Ion Etching). As a result, a pattern of the photo resist pattern R is transcribed into the mask material.

Figure 7C:
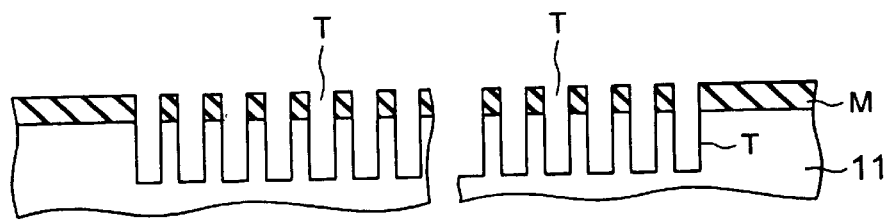

Next, as shown in FIG. 7C, the photo resist pattern R is exposed to oxide atmosphere in order to eliminate by carbonization. Furthermore, the silicon substrate 11 is patterned by the anisotropic etching such as RIE, in order to form a plurality of trenches in two-dimensional array on surface of the silicon substrate 11.

Here, the trench T is a hole of substantially round shape, and for example, a radius is 0.2 $\mu$s, a depth is about 2 $\mu$m, a shortest interval between the trenches is about 0.8 $\mu$m.

It is desirable to form the mask material by using materials that the etching speed is sufficiently later than that of the silicon when pattering the silicon substrate 11 by the anisotropic etching. For example, when using the RIE for the anisotropic etching, the silicon oxide file or a film laminated by the silicon nitride film and the silicon oxide film is desirable.

Next, after removing the mask material M, a high temperature anneal is carried out in non-oxide atmosphere under reduced pressure, preferably in atmosphere to reduce $SiO_2$, for example, a 100% hydrogen atmosphere at 1100° C. and 10 torr. As a result, after going through step of FIG. 7D, as shown in FIG. 7E, openings of each trench T are closed up in order to form the voids V. Furthermore, the voids V formed by each trench T combines with each other. As a result, a single flat plate-shape void 13 emerges.

Figure 7D:
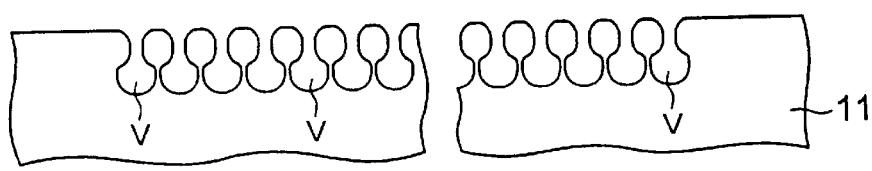
Figure 7E:
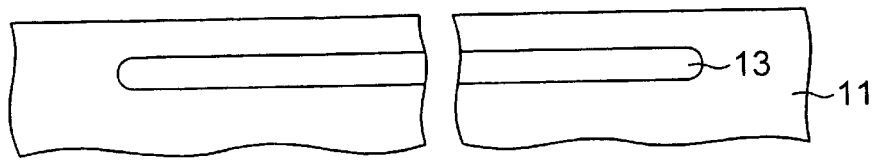

Shape distortion of the surface of the silicon substrate 11 shown in FIG. 7D through FIG. 7E occurs due to a surface migration of silicon atoms to minimize the surface energy, after the silicon oxide film of the surface of the silicon substrate is removed.

Figure 6B:
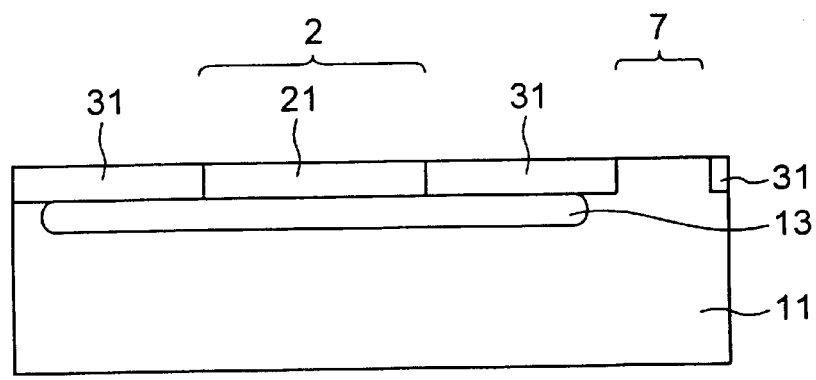

Hereinafter, the manufacturing steps will be described again with reference to FIG. 6. After forming the flat plate-shape void 13 by the above-mentioned ESS method, as shown in FIG. 6B, a pn junction transistor is formed on the flat plate-shape single crystal silicon layer existing on the flat plate-shape void 13, thereby constituting the detecting layer 21 which thermally detects the thermal type infrared sensor. Furthermore, a pn junction transistor to read out the electric signal is formed in the processing circuit section 7. It is possible to fabricate the insulating film 3 by using a LOCOS in order to perform element separation of the transistors of the detecting layer 21 and the processing circuit section 7.

Figure 6C:
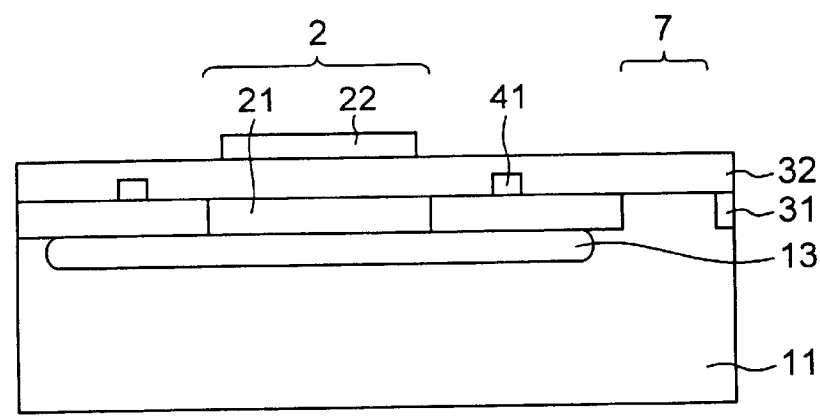

Next, as shown in FIG. 6C, an interconnection 41 is formed as a path for transmitting the signal from the detecting portion 2 to the processing circuit section 7. Next, an insulating film 32 is laminated on whole area of the silicon substrate 11, and then a infrared absorption layer 22 is formed only on the detecting portion 2.

Figure 6D:
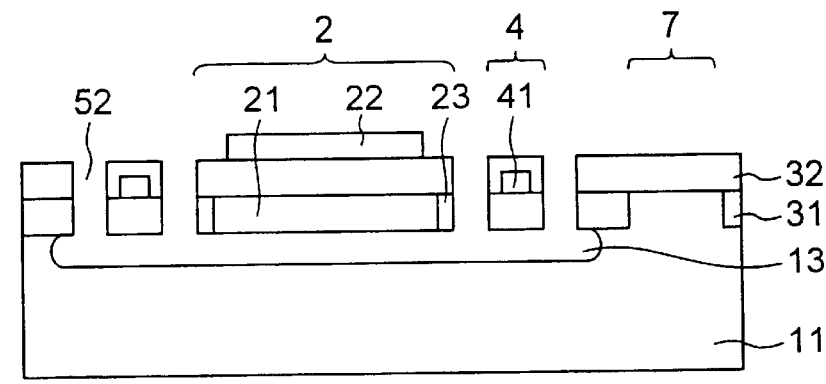

Next, as shown in FIG. 6D, the support leg 4 is patterned. More specifically, for example, the insulating film 31 and 32 are patterned by using a micro machining technology and so on, in order to make a support leg forming groove 52. As a result, a shape that the detecting portion 2 is supported from a side face direction by the support leg 4 on the silicon substrate 11 is completed.

As described above, according to the present invention, in the state of fabricating the support leg-forming groove 52, because the thermal separation from the substrate 11 is already completed, it is unnecessary to carry out the etching. Because the substrate 11 that the flat plate-shape void 13 is formed by using the ESS method is used, it is possible to cut down total cost at the element-fabricating step more than the case of using the SOI substrate.

Furthermore, when using the SOI substrate, the thicknesses of the single crystal silicon layer and the insulating film have little choice but to be equal to that of the detecting portion 2. On the other hand, when the structure of the present invention and the manufacturing method of according to the present invention is used, it is possible to design the elements of the peripheral circuit section without being restricted to the structure of the detecting portion 2.

Second Embodiment

A second embodiment has a feature in which a partial void is provided to a portion of the processing circuit section 7.

FIG. 8A is a sectional drawing of main parts of a thermal type infrared sensor according to the second embodiment. FIG. 8B is an enlarged sectional drawing of the processing circuit section 7 in the sensor of FIG. 8A.

The infrared sensor according to the present embodiment is provided with a partial void 14 which is formed in a portion of the processing circuit section 7 in the first embodiment. That is, in FIG. 8 numeral 11 denotes a silicon substrate, numeral 31 denotes an insulating film embedded to perform the element separation by using a STI (Shallow Trench Isolation), numerals 72 and 73 denote a source diffusion layer and a drain diffusion layer, respectively, numeral 74 denotes a gate oxide film, and numeral 75 denotes a gate electrode. That is, any one of the elements in the processing circuit section 7 is composed of a MOS transistor 71. Furthermore, the partial void 14 can be formed under the gate electrode 75 in the silicon substrate 11, by using the above-mentioned ESS method.

According to the structure of the present embodiment, it is possible to restrict spread of a depletion layer in a channel region of the MOS transistor 71, thereby reducing a short channel effect. Furthermore, because the partial void 14 is formed under the source diffusion layer 72 and the drain diffusion layer 73, it is possible to reduce the element capacity.

These effects can obtain even by using the SOI substrate. However, in the structure of the present embodiment, because the MOS transistor 71 is only partially insulated from the silicon substrate 11, the substrate floating effect never occur, and it is possible to provide the element which stably operates without initiating the substrate floating effect. Furthermore, when using the ESS method, the thickness of the semiconductor layer in the MOS transistor 71 on the partial void 14 can be arbitrarily decided. Accordingly, the structural restriction due to the thickness of the detecting layer 21 in the detecting portion 2 is free.

In FIG. 8, although the example of forming the partial void 14 has been shown, the partial void 14 and the flat plate-shape void 13 may unit to each other. That is, as shown in FIG. 6A, after the flat plate-shape void is formed, the detecting portion 2 may be formed to center of the void, and the processing circuit section 7 may be formed on the void in a corner section of the flat plate-shape void.

Third Embodiment

A third embodiment has a feature in which an internal wall of the flat plate-shape void 13 is provided with an oxide film.

FIG. 9 is a sectional drawing of main parts of a thermal type infrared sensor according to the third embodiment of the present invention. In FIG. 9, constituents common to FIGS. 3–8 are denoted with the same reference numerals, and a detailed description is omitted.

In the present embodiment, an oxide film-in-void 15 is provide inside of the flat plate-shape void 13. That is, the oxide film-in-void 15 is formed by thermally oxidizing the flat plate-shape void 13 formed by the ESS method in order to form the oxide film-in-void 15.

The structure of the present embodiment has an advantage in which element separation of the detecting layer 21 is easy. That is, as shown in FIG. 4 and FIG. 5, in case of carrying out the element separation to form a plurality of the pn junction elements, the oxide film-in-void 15 functions as the etching stop layer, when forming the element separation groove by the RIE. As a result, even when the detecting layer 21 is a thin flat plate-shape semiconductor film, for example, with thickness of 200 nm, it is possible to perform the element separation by the STI (Shallow Trench Isolation) technology.

Because the oxide film in void 15 exists on bottom face of the detecting layer 21, an effect as a protection oxide film of the detecting layer is obtained.

For example, after forming the support leg 4 by the steps showing in FIG. 6D, it is possible to form the oxide film-in-void 15 by oxidizing the internal wall of the void 13 while exposing to the oxide atmosphere.

Fourth Embodiment

A fourth embodiment has a feature in which an optical distance to depth direction of the flat plate-shape void 13 is set to ¼ of a wavelength of the incident infrared ray.

FIG. 10 is a sectional view of main part of a thermal type infrared sensor according to the fourth embodiment of the present invention. Even in FIG. 10, constituents common to FIGS. 3–9 are denoted with the same reference numerals, and a detailed description is omitted.

In the present embodiment, an optical distance D in depth direction of the flat plate-shape void 13 is set to ¼ of wavelength of the incident infrared ray. For example, when wavelength of the infrared ray is 10 $\mu$m, the depth D of the flat plate-shape void 13 is set to about 2.5 $\mu$m.

This structure is fabricated by using, for example, the ESS method. According to the ESS method, it is possible to form the flat plate-shape void that controllability of shape and depth sizes are excellent. According to the structure of the present embodiment, the infrared ray passing through the detecting portion 2 after being incident from above is reflected on bottom face of the flat plate-shape void 13. Therefore, intensity of the infrared ray is maximized at a location of the detecting layer 21, and it is possible to improve the intensity of the output signal. That is, it is possible to further improve sensitivity for the infrared ray.

As described above, the embodiment of the present invention has been described with reference to a concrete example. However, the present invention is not limited to the above concrete example.

For example, in the above concrete example, the semiconductor elements of the detecting layer and the processing circuit section includes the pn junction. The present invention is applicable in the same way, even when using the semiconductor elements of the other constituents.

Furthermore, technology for fabricating the flat plate-shape void is not limited to the ESS method. The present invention is applicable to all types of methods which form the void in the substrate and the crystal on the void is a single crystal.

It is possible to use a substrate made of the other semiconductor materials, dielectric materials, or insulating materials. Furthermore, it is possible to diversely modify so as not to derogate subjects of the present invention.

What is claimed is:

1. A method of manufacturing a thermal type infrared sensor including a detecting portion configured to absorb an infrared ray and perform thermoelectric conversion, and a processing circuit section including semiconductor elements to process an electric signal obtained by said detecting portion, said detecting portion being supported above a semiconductor substrate so as to be apart from said semiconductor substrate by at least one support leg extending to a side face of said detecting portion, comprising the steps of:

forming a plurality of first trenches on the semiconductor substrate;

closing up an opening of each of said plurality of first trenches in order to form a first void of flat shape and a single crystal silicon layer on said first void, by performing heat treatment to the semiconductor substrate;

forming said detecting portion in said single crystal silicon layer above said first void;

forming said processing circuit section on said semiconductor substrate; and forming said support leg by forming a groove of penetrating to said first void to periphery of said detecting portion.

2. The method of manufacturing the thermal type infrared sensor according to claim 1, wherein said detecting portion is surrounded by said groove, and said processing circuit section is formed on the outside of said groove.

3. The method of manufacturing the thermal type infrared sensor according to claim 1, further comprising:

forming a second void right under said semiconductor elements in said processing circuit section.

4. The method of manufacturing the thermal type infrared sensor according to claim 3, said forming said second void comprising:
  forming a plurality of second trenches on said semiconductor substrate in array; and
  closing up opening of each of said plurality of second trenches to change said second trenches into said second void with a single crystal semiconductor layer thereabove, by performing a heat treatment to said semiconductor substrate.

5. The method of manufacturing the thermal type infrared sensor according to claim 3, wherein said first void and said second void are formed at a depth different from each other.

6. The method of manufacturing the thermal type infrared sensor according to claim 1, wherein said detecting portion includes one or more of pn junction semiconductor elements, each of the pn junction semiconductor elements being separated by an insulating layer.

7. The method of manufacturing the thermal type infrared sensor according to claim 6, wherein one or more of said pn junction semiconductor elements is connected in series.

8. The method of manufacturing the thermal type infrared sensor according to claim 6, wherein each of one or more of said pn junction semiconductor elements includes a p type region and a n type region stacked in the depth direction of said semiconductor substrate.

9. The method of manufacturing the thermal type infrared sensor according to claim 6, wherein each of one or more of said pn junction semiconductor element includes, a $p^+$ region, a $n^+$ region and a $p^-$ region therebetween.

10. The method of manufacturing the thermal type infrared sensor according to claim 1, further comprising forming an oxide film on an internal wall of said first void, by oxidizing the internal wall of said first void after forming said support leg.

11. The method of manufacturing the thermal type infrared sensor according to claim 1, wherein the infrared ray incoming into said first void is reflected on the bottom face of said first void, and then is incident on said detecting portion; and an optical distance of the infrared ray in the depth direction of said first void is substantially ¼ of a wavelength of a detected infrared ray.

* * * * *